(12) United States Patent
Hsu

(10) Patent No.: US 10,680,374 B2
(45) Date of Patent: Jun. 9, 2020

(54) ELECTRICAL CONTACT

(71) Applicants: FU DING PRECISION COMPONENT (SHEN ZHEN) CO., LTD., Shenzhen (CN); FOXCONN INTERCONNECT TECHNOLOGY LIMITED, Grand Cayman (KY)

(72) Inventor: Shuo-Hsiu Hsu, New Taipei (TW)

(73) Assignees: FU DING PRECISION COMPONENT (SHEN ZHEN) CO., LTD., Shenzhen (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/396,766

(22) Filed: Apr. 29, 2019

(65) Prior Publication Data

US 2019/0334273 A1    Oct. 31, 2019

(30) Foreign Application Priority Data

Apr. 27, 2018  (CN) .......................... 2018 1 0390160
Apr. 27, 2018  (CN) .......................... 2018 1 0390178

(51) Int. Cl.
*H01R 13/24*   (2006.01)
*H01R 13/15*   (2006.01)
(Continued)

(52) U.S. Cl.
CPC ........... *H01R 13/2442* (2013.01); *H01R 4/02* (2013.01); *H01R 12/57* (2013.01); *H01R 12/71* (2013.01);
(Continued)

(58) Field of Classification Search
CPC ............................ H01R 13/15; H01R 13/2442
See application file for complete search history.

(56) References Cited

U.S. PATENT DOCUMENTS 7,563,105 B2 *  7/2009  Liu ..................... H01R 13/2492
                                                   439/66
8,851,904 B2 * 10/2014  Chang ..................... H05K 7/10
                                                   439/71
(Continued)

FOREIGN PATENT DOCUMENTS

CN     2641846 Y    9/2004
CN   201142501 Y   10/2008
(Continued)

*Primary Examiner* — James Harvey
(74) *Attorney, Agent, or Firm* — Wei Te Chung; Ming Chieh Chang

(57) ABSTRACT

An electrical connector includes an insulative housing retaining a plurality of contacts therein. The contact includes a mating part with a first body and a spring arm extending therefrom for mating a conductive pad of a CPU (Central Processing Unit), and a soldering part with a second body and a solder tail extending therefrom for mounting a solder ball thereon. The spring arm is downwardly pressed by the CPU to contact the soldering part when the CPU is mounted upon the electrical connector The mating part and the soldering part are spaced from each other either without any connection, or alternately linked with each other via a bridge transversely connected therebetween wherein the latter may optionally omit the barbed structure from one of the mating part and the soldering part.

17 Claims, 18 Drawing Sheets

(51) Int. Cl.
*H01R 12/57* (2011.01)
*H01R 4/02* (2006.01)
*H01R 12/71* (2011.01)
*H05K 7/10* (2006.01)

(52) U.S. Cl.
CPC ......... *H01R 13/15* (2013.01); *H01R 13/2407* (2013.01); *H01R 13/2485* (2013.01); *H05K 7/1069* (2013.01)

(56) References Cited

U.S. PATENT DOCUMENTS

| | | | | |
|---|---|---|---|---|
| 9,033,737 | B2* | 5/2015 | Chang | H01R 13/6588 439/607.05 |
| 2003/0104731 | A1* | 6/2003 | Chang | H01R 13/2442 439/862 |
| 2005/0020101 | A1* | 1/2005 | Deng | H01R 13/2442 439/71 |
| 2005/0045363 | A1* | 3/2005 | Ju | H01R 12/57 174/94 R |
| 2009/0263985 | A1* | 10/2009 | Liu | H01R 13/2457 439/66 |
| 2013/0237091 | A1* | 9/2013 | Mason | H01R 13/6585 439/607.05 |
| 2014/0080327 | A1* | 3/2014 | Hwang | H01R 13/6585 439/65 |
| 2019/0089098 | A1* | 3/2019 | Cheng | H01R 13/6471 |
| 2019/0326690 | A1* | 10/2019 | Ho | H01R 12/716 |
| 2019/0326697 | A1* | 10/2019 | Ho | H05K 3/00 |
| 2019/0334273 | A1* | 10/2019 | Hsu | H01R 12/707 |

FOREIGN PATENT DOCUMENTS

| | | |
|---|---|---|
| CN | 201278388 Y | 7/2009 |
| CN | 206283019 U | 6/2017 |
| TW | 200835079 | 8/2008 |
| TW | M411697 | 9/2011 |
| TW | M437555 | 9/2012 |

\* cited by examiner

ELECTRICAL CONTACT

BACKGROUND OF THE INVENTION

1. Field of the Invention

The present invention relates generally to an electrical contact, and more particularly to the electrical contact for use within an electrical connector connecting a chip module to a print circuit board.

2. Description of Related Arts

China Patent No. CN206283019 discloses an electrical connector with contacts therein wherein the contact includes a retaining section for retaining the whole contact to the housing, a soldering section at the bottom of the retaining section soldered to the printed circuit board via a solder ball, and a resilient spring arm with the contacting section intentionally extending initially slightly backward and successively significantly forwardly with respective to the plane defined by the retaining section for increasing the length thereof for better mechanical performance. Anyhow, even though the relatively longer spring arm is welcome from the mechanical viewpoint, the longer the resilient contacting section and the inherent electrical transmission path are, the worse the electrical performance is.

Hence, an electrical contact with improved structure to meet both the mechanical performance and the electrical performance is desired.

SUMMARY OF THE INVENTION

To achieve the above object, an electrical connector for connecting a chip module to a print circuit board, includes an insulative housing with therein a plurality of passageways extending through opposite top surface and bottom surface of the housing, and a plurality of contacts respectively retained in the corresponding passageways, respectively. The contact includes a mating part with a first body and a spring arm extending therefrom for mating a conductive pad of a CPU (Central Processing Unit), and a soldering part with a second body and a solder tail extending therefrom for mounting a solder ball thereon. The spring arm is downwardly pressed by the CPU to contact the soldering part when the CPU is mounted upon the electrical connector The mating part and the soldering part are spaced from each other either without any connection, or alternately linked with each other via a bridge transversely connected therebetween wherein the latter may optionally omit the barbed structure from one of the mating part and the soldering part.

Other advantages and novel features of the invention will become more apparent from the following detailed description of the present embodiment when taken in conjunction with the accompanying drawings.

DETAILED DESCRIPTION OF THE PREFERRED EMBODIMENT

Figure 1:
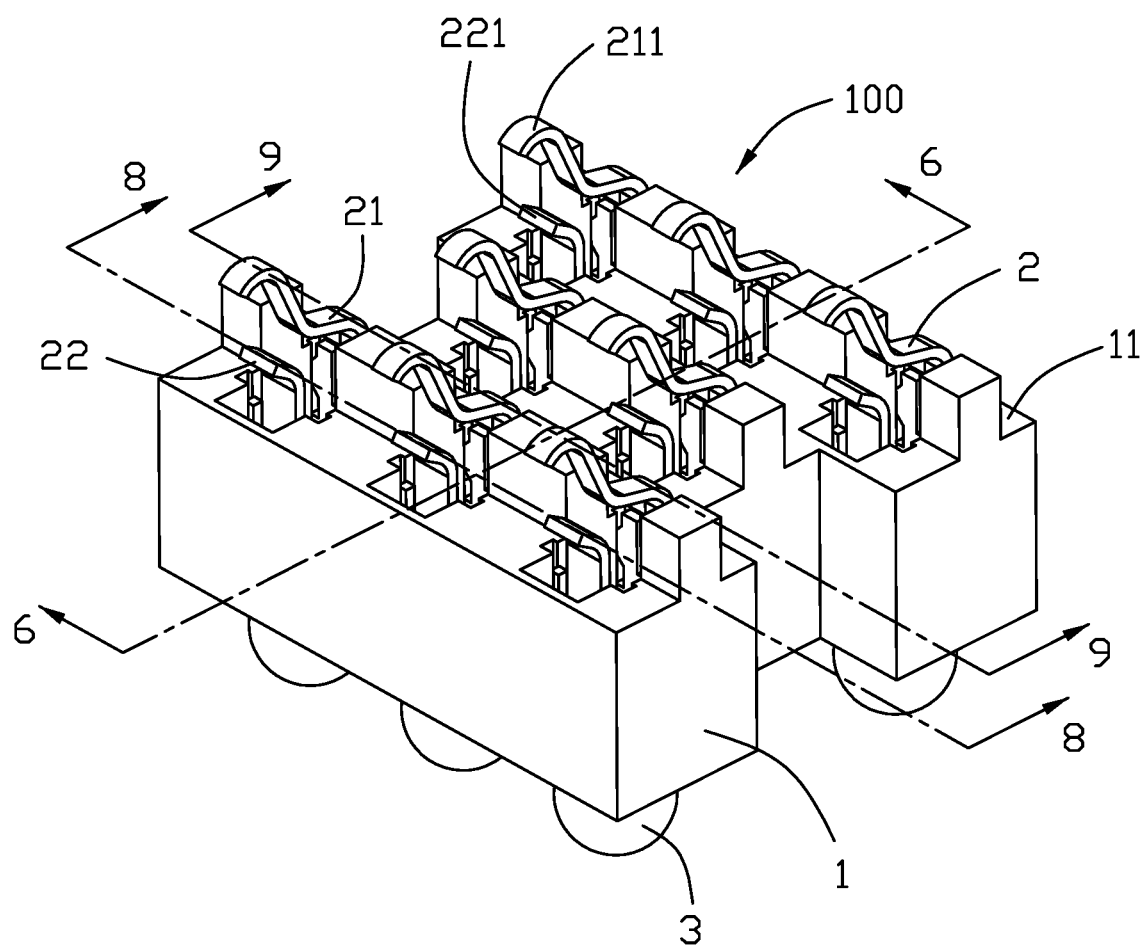
FIG. 1 is a perspective view of the electrical connector of a first preferred embodiment of the present invention.
Figure 2:
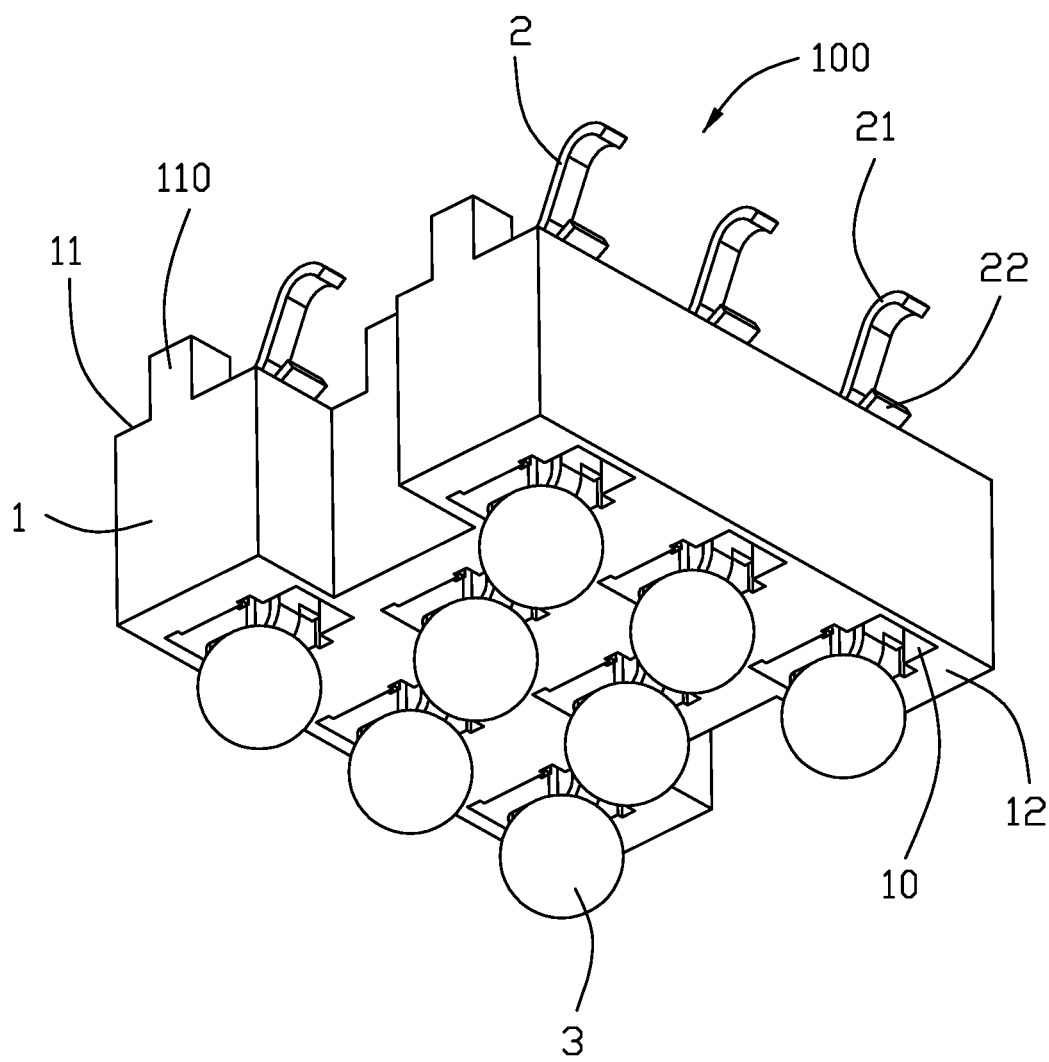
FIG. 2 is another perspective view of the electrical connector of FIG. 1.
Figure 3:
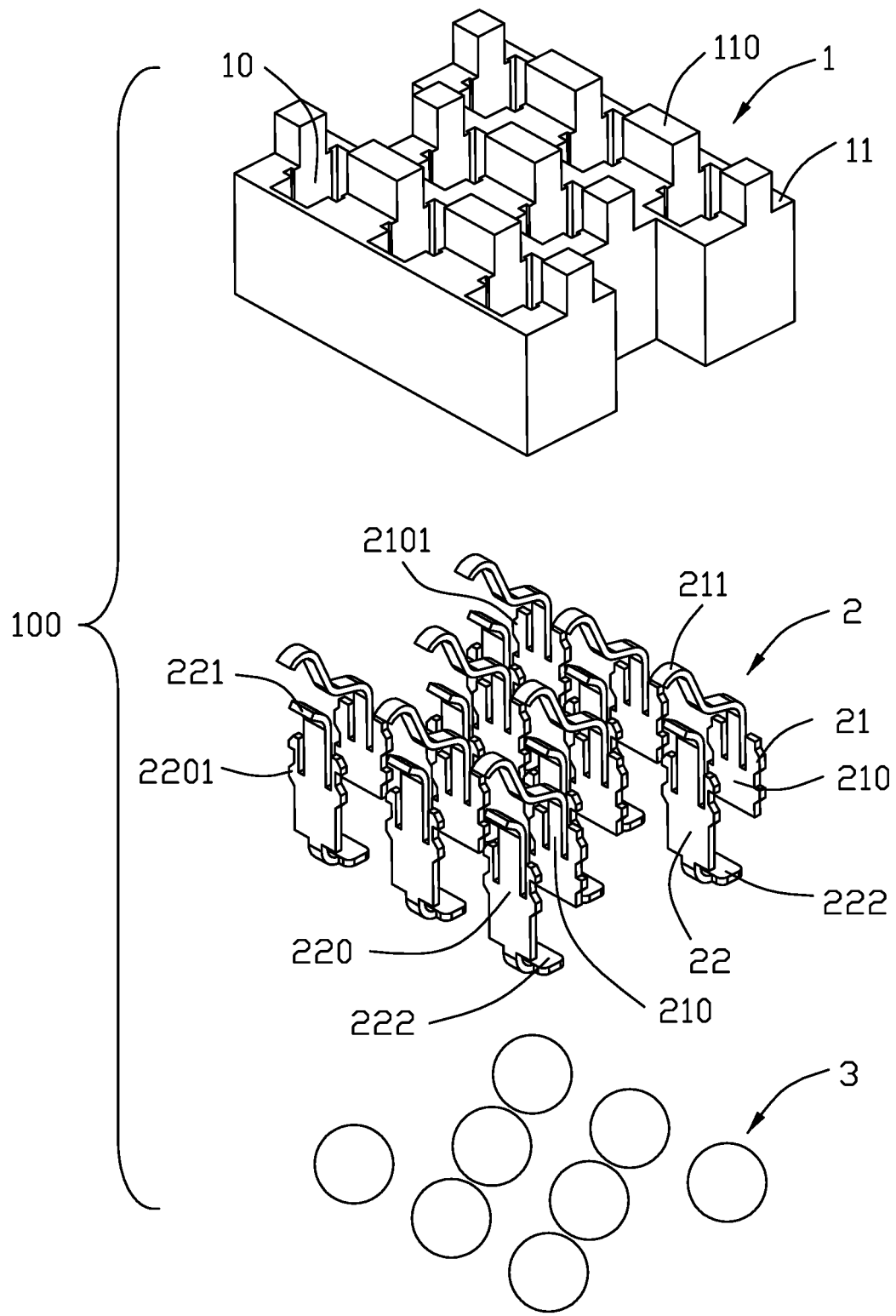
FIG. 3 is an exploded perspective view of the electrical connector of FIG. 1.
Figure 4:
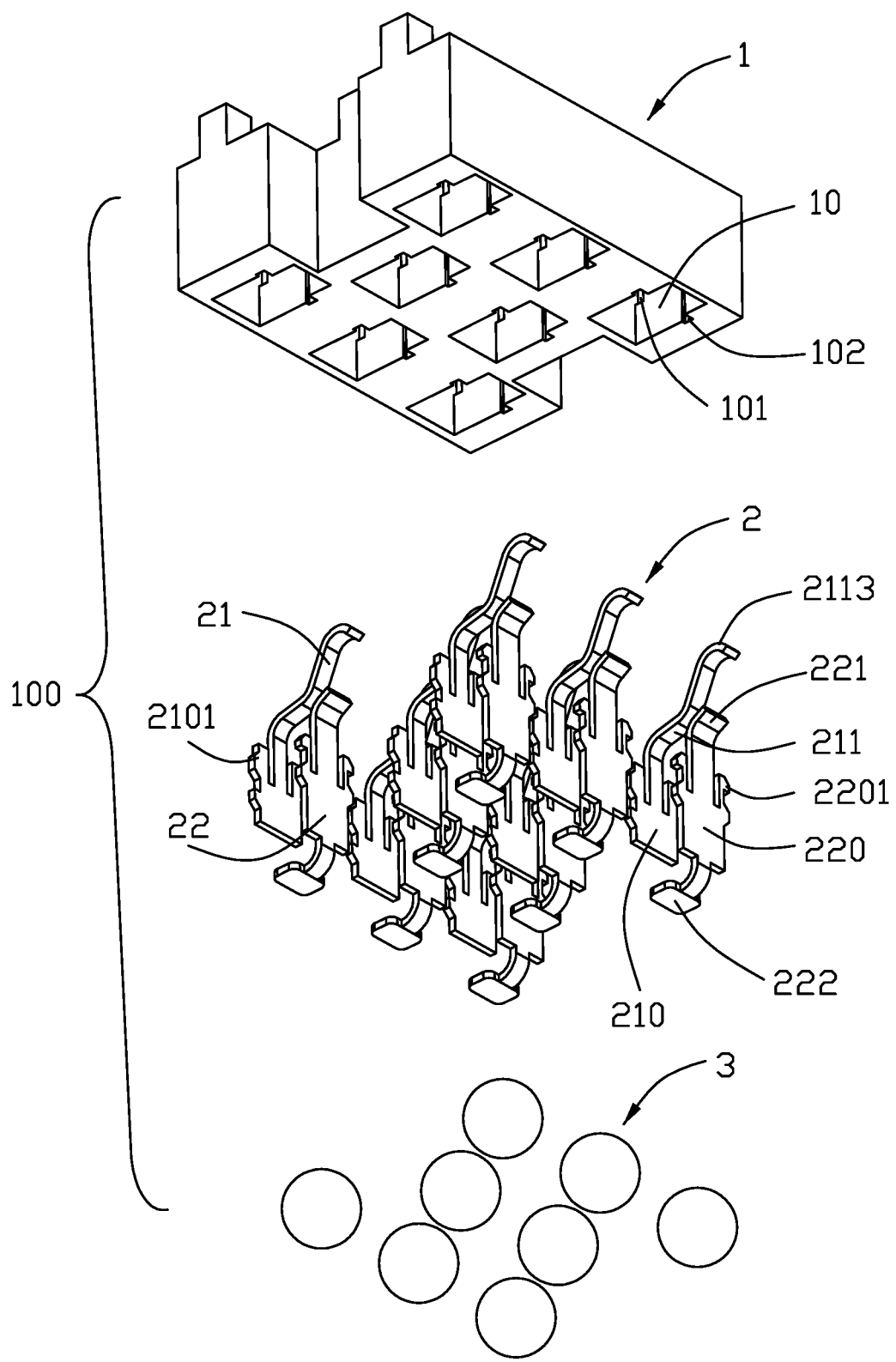
FIG. 4 is another exploded perspective view of the electrical connector of FIG. 3.
Figure 5:
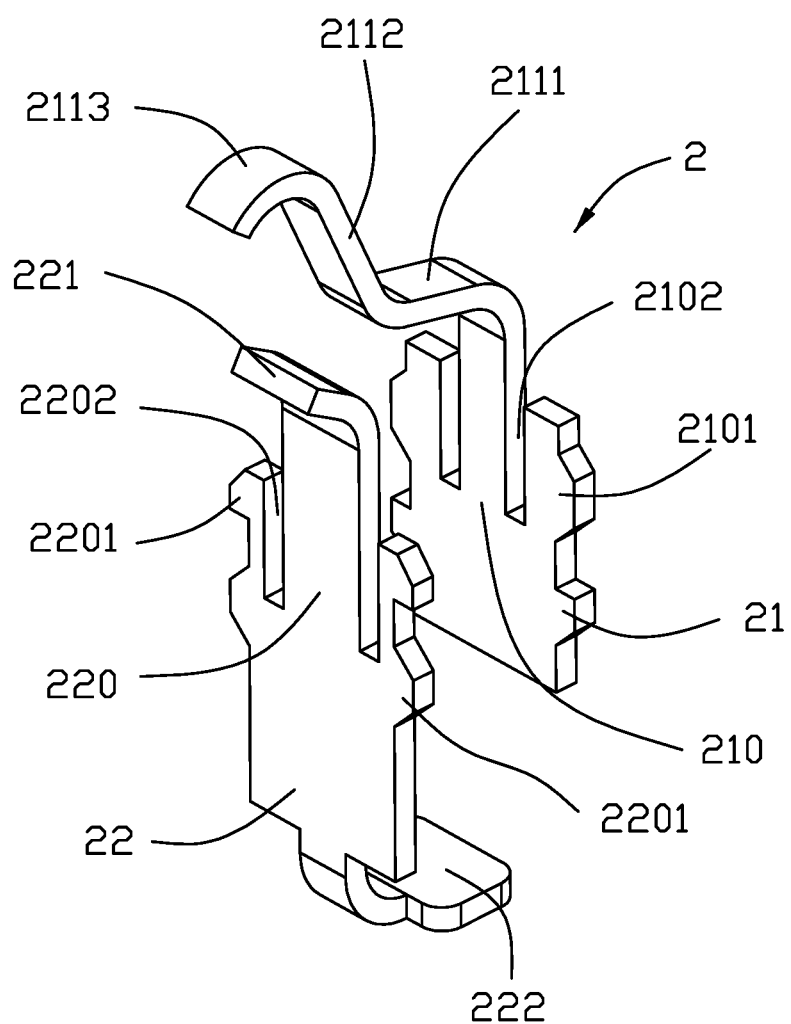
FIG. 5 is a perspective view of the contact for use within the electrical connector of FIG. 1.
Figure 6:
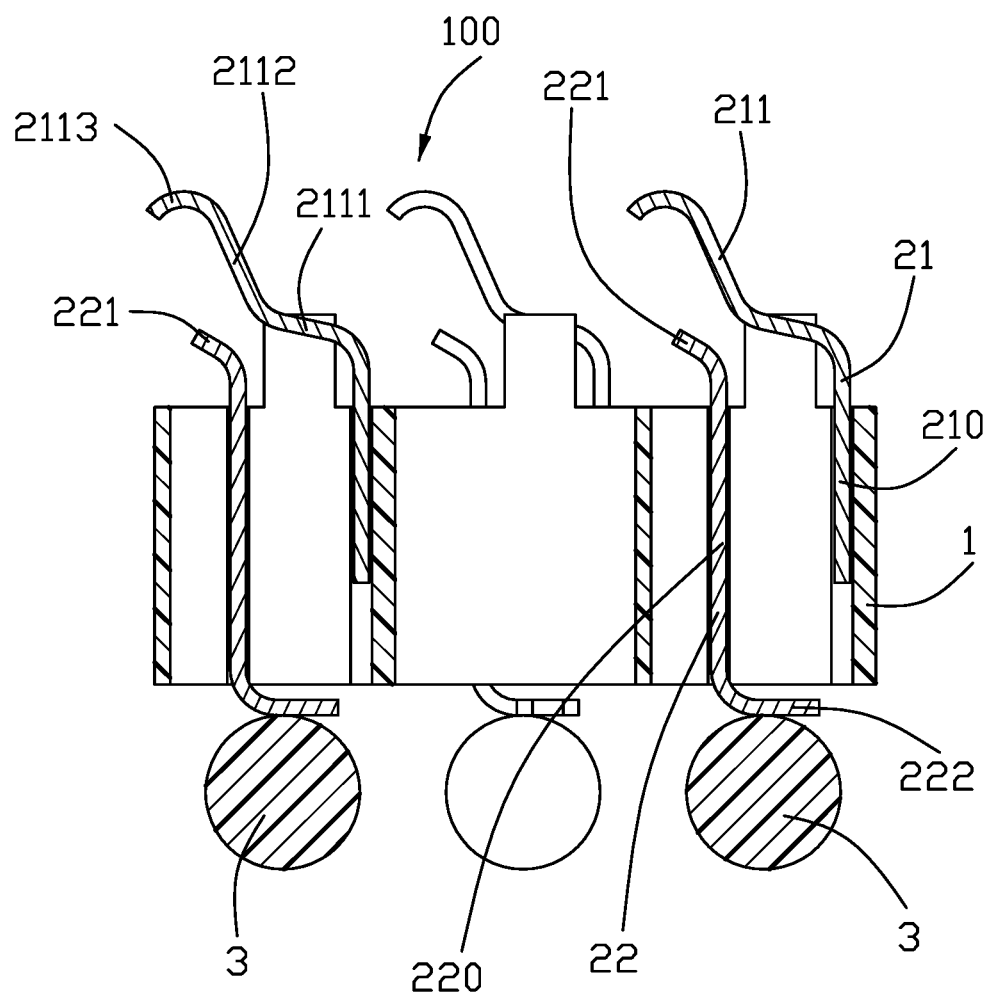
FIG. 6 is a cross-sectional view of the electrical connector of FIG. 1 along line 6-6.
Figure 7:
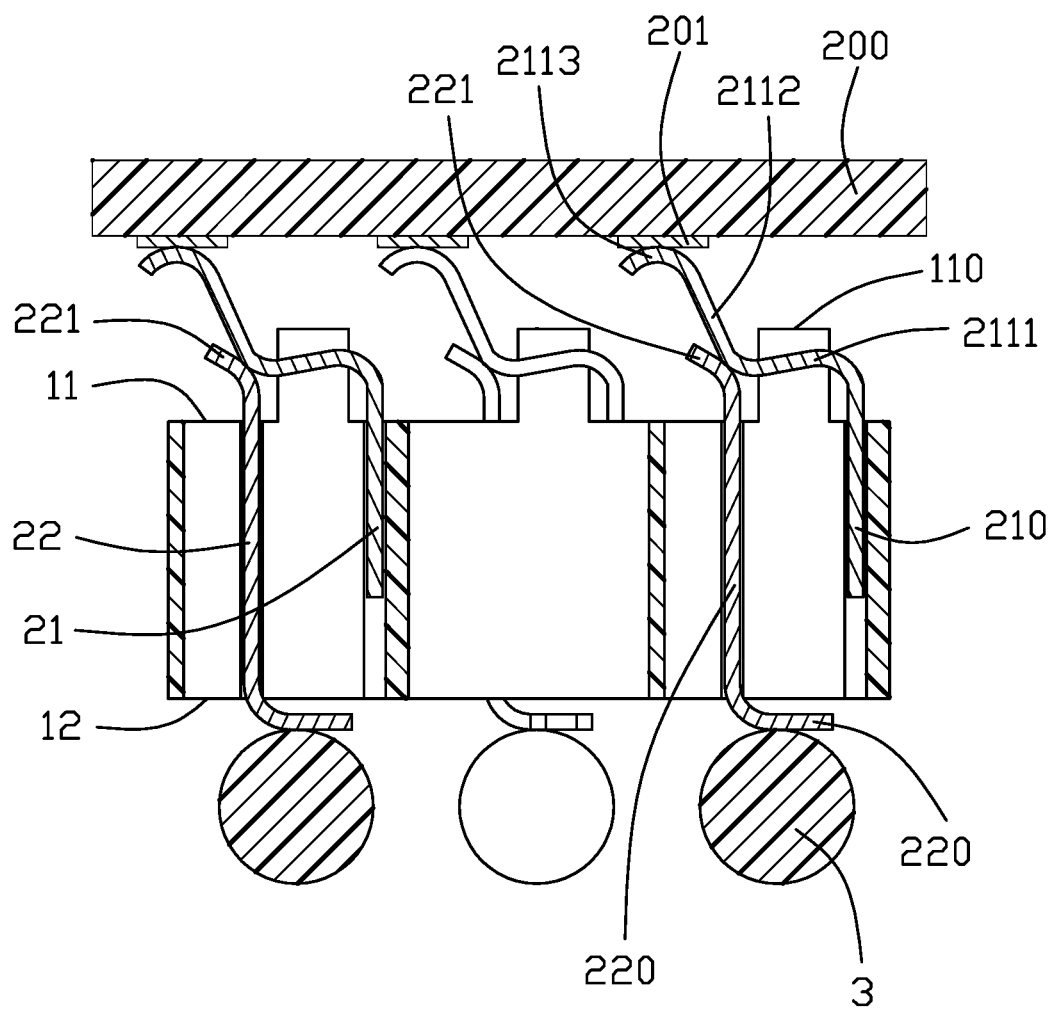
FIG. 7 is another cross-sectional view of the electrical connector of FIG. 1 wherein the spring arm is deflected downwardly by the CPU.
Figure 8:
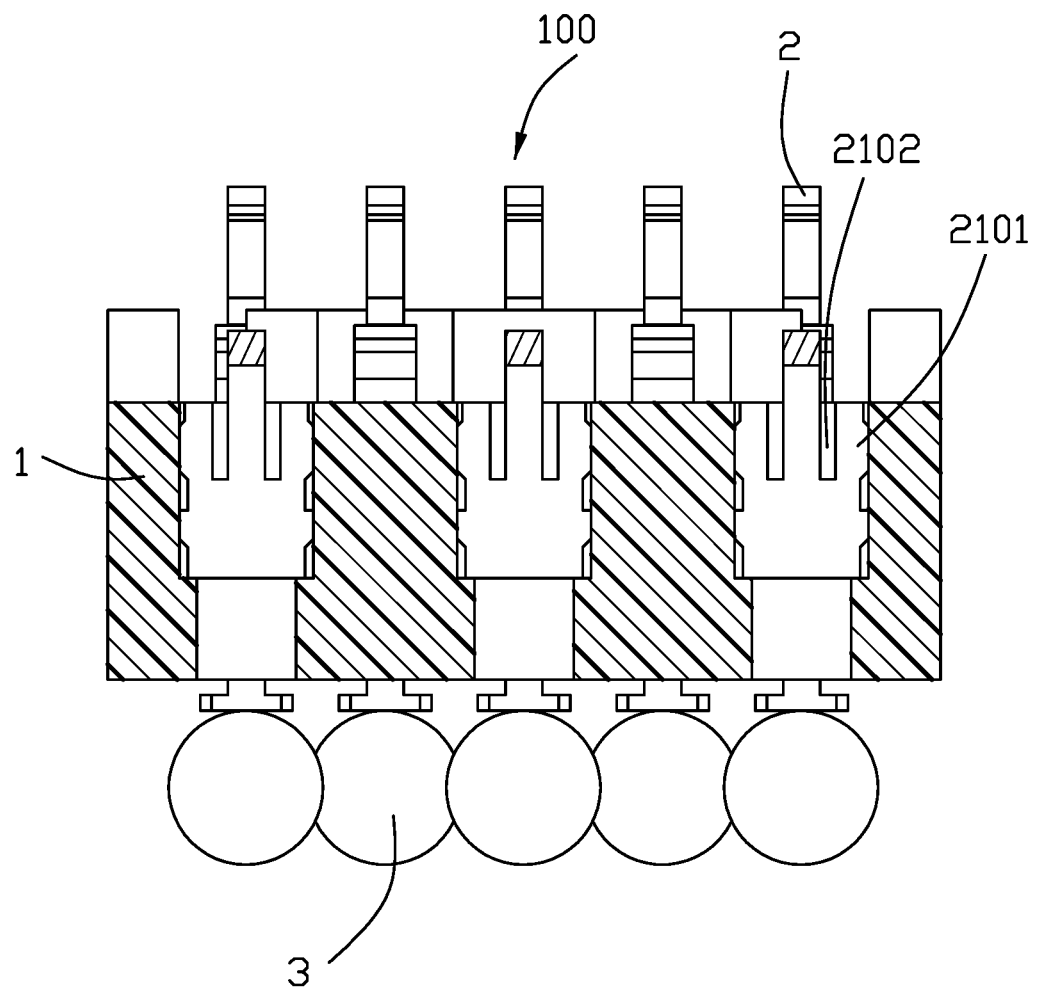
FIG. 8 is a cross-sectional view of the electrical connector of FIG. 1 along line 8-8.
Figure 9:
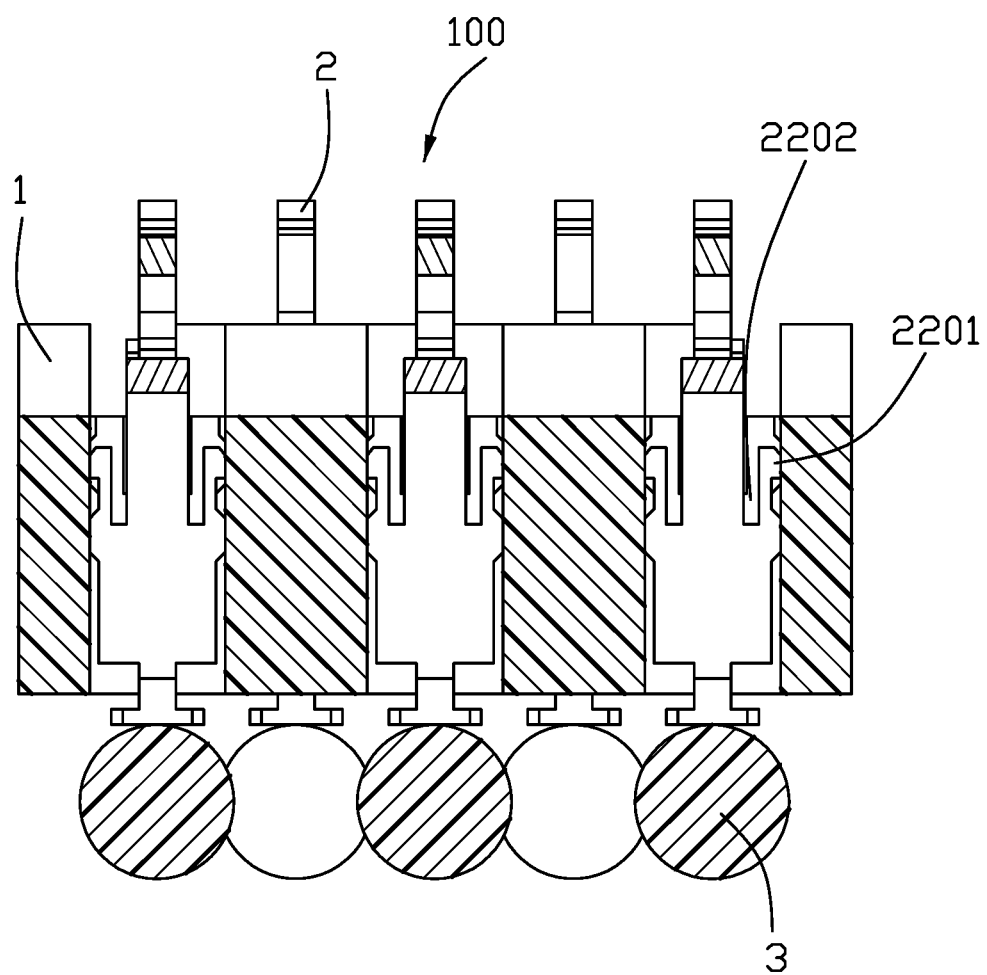
FIG. 9 is a cross-sectional view of the electrical connector of FIG. 1 along line 9-9.

Referring to FIGS. 1-9, an electrical connector 100 for connecting an electronic package or CPU 200 to a printed circuit board (not shown), includes an insulative housing 1 with plurality of passageways 10 therein, and a plurality of contacts 2 respectively retained in the corresponding passageways 10. The housing 1 includes opposite top surface 11 and bottom surface 12. The passageways 10 extend through both the top surface 11 and the bottom surface 12. The contact 2 includes a mating part 21 and a soldering part 22 opposite to each other in a sideward direction. The mating part 21 includes a first body 210 and a spring arm 211 extending from the first body 210 and beyond the top surface 11. When operation, the spring arm 211 is downwardly pressed by the CPU so as to contact the soldering part 22. The soldering part 22 includes a second body 220, a soldering pad 222 at the bottom end of the second body 220, and a curved support arm 221 at the top end of the second body 220. The support arm 221 is located under the spring arm 211 so as to contact the spring arm 221 when the spring arm 211 is downwardly pressed by the CPU 200. The soldering pad 222 is attached to the printed circuit board (not shown) via the solder ball 3. In this embodiment, the support arm 221 extends above the top surface 11, and the soldering pad 222 is located below the bottom surface 12.

The spring arm 211 includes a bending section 2111 extending from the first body 210 toward the solder part 22, an oblique section 2112 extending upwardly from the bending section 2111, and a contacting section 2113 extending from the oblique section 2112. The CPU 200 forms a conductive pad 201 for contacting the contacting section 2113.

The support arm 221 extends oblique away from the mating part 21. When the spring arm 211 is downwardly pressed by the CPU 200 to contact the support arm 221, the joint between the bending section 2111 and the oblique section 2112 may move along the support arm 221, thus avoiding yielding of the spring arm 211. In addition, the housing 1 forms standoffs 110 on the top surface beside the corresponding passageways 10, respectively. The further downward movement of the spring arm 211 is stopped when the CPU 200 is seated upon the standoffs 110 so as to make sure of no yielding of the spring arm 211 due to excessive deflection.

Notably, during operation, a relatively short electrical path for preferred electrical performance is formed between the CPU 200 and the printed circuit board via the contacting section 2113, the oblique section 2112 and the solder part 22. Simultaneously, the relatively long spring arm 211 may provide the preferred mechanical characteristics when the spring arm 211 is deformed initially as a cantilevered beam and successively as a restrained beam, thus enhancing the strength thereof for superior mechanical performance.

The first body 210 and the second body 220 are essentially parallel to each other to be seated upon the interior surfaces in the corresponding passageway 10. The first body 210 is equipped with first barbs 2101 for engagement within the first grooves 101 to retain the mating part 21 in the corresponding passageway 10, and the second body 220 is equipped with the second barbs 2201 for engagement within the second grooves 102 to retain the soldering part 22 in the corresponding passageway 10 opposite to the mating part 21.

In the first embodiment, a pair of first slits 2102 are formed in the first body 210 to increase not only the length of the spring arm 211 and the associated resiliency thereof for better mating effect with the CPU, but also the deformability of the first body 210 around the first barbs 2101 for better retention of the mating part 21 in the passageway 10. Similarly, a pair of second slits 2201 are formed in the second body 220 as well.

Figure 10:
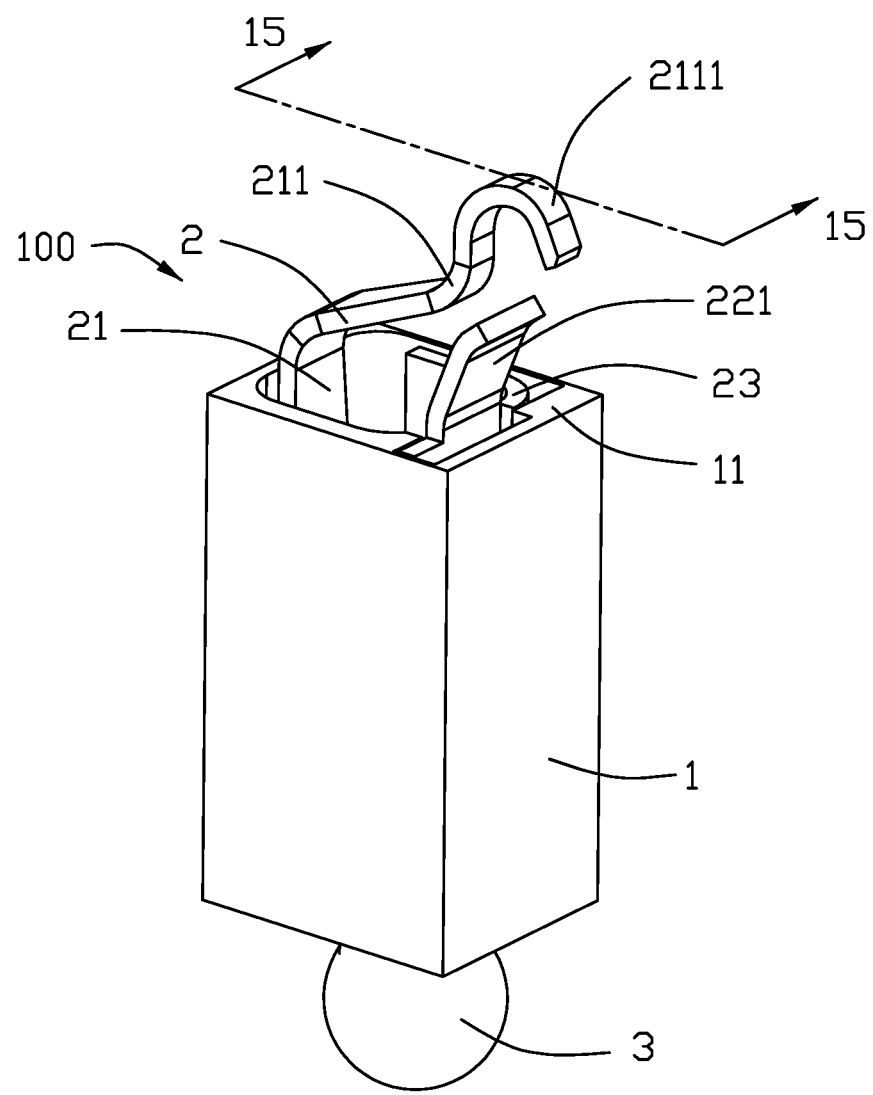
FIG. 10 is a perspective view of a part of the electrical connector according to a second embodiment of the invention.
Figure 11:
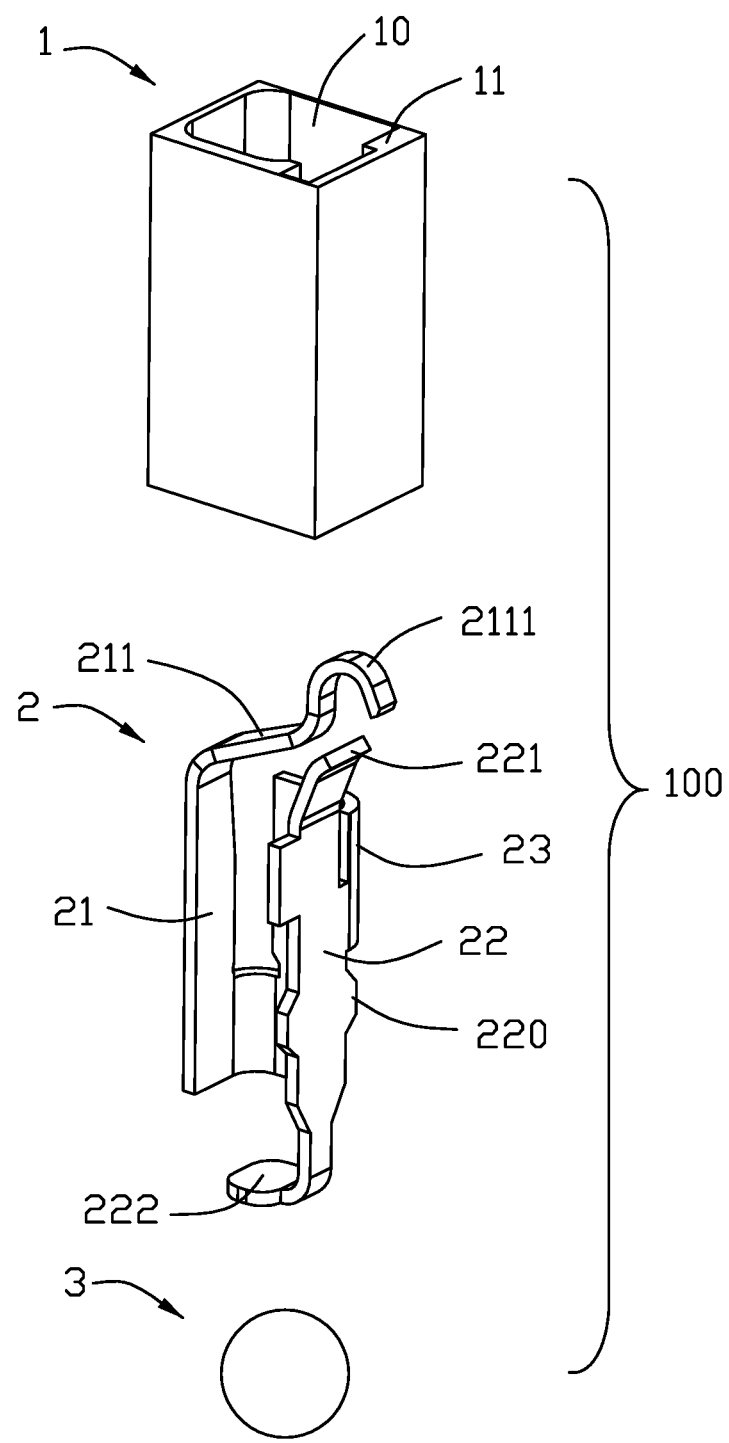
FIG. 11 is an exploded perspective view of the electrical connector of FIG. 10.
Figure 12:
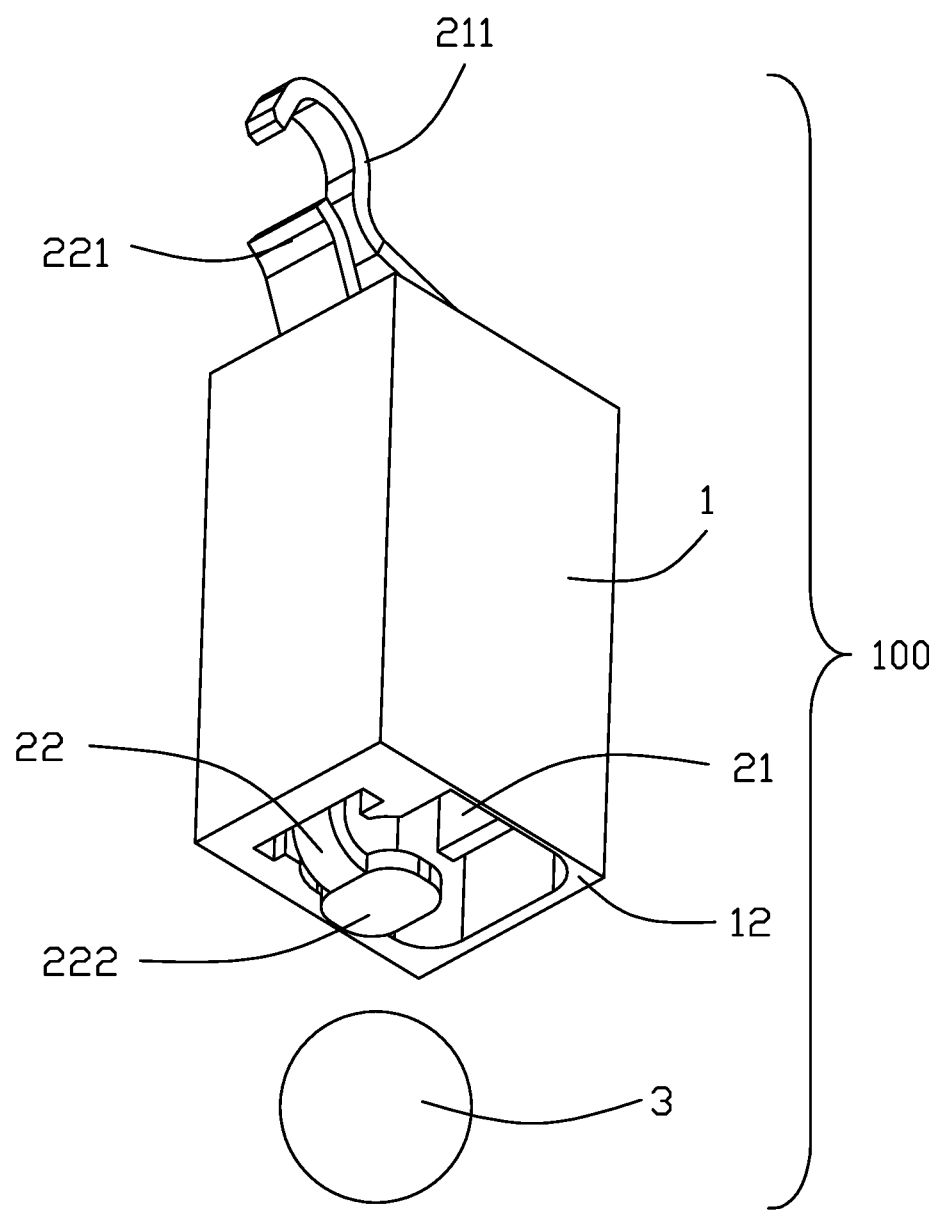
FIG. 12 is another exploded perspective view of the electrical connector of FIG. 10 wherein the contact is disposed in the housing while the solder ball is removed away from the solder tail.
Figure 13:
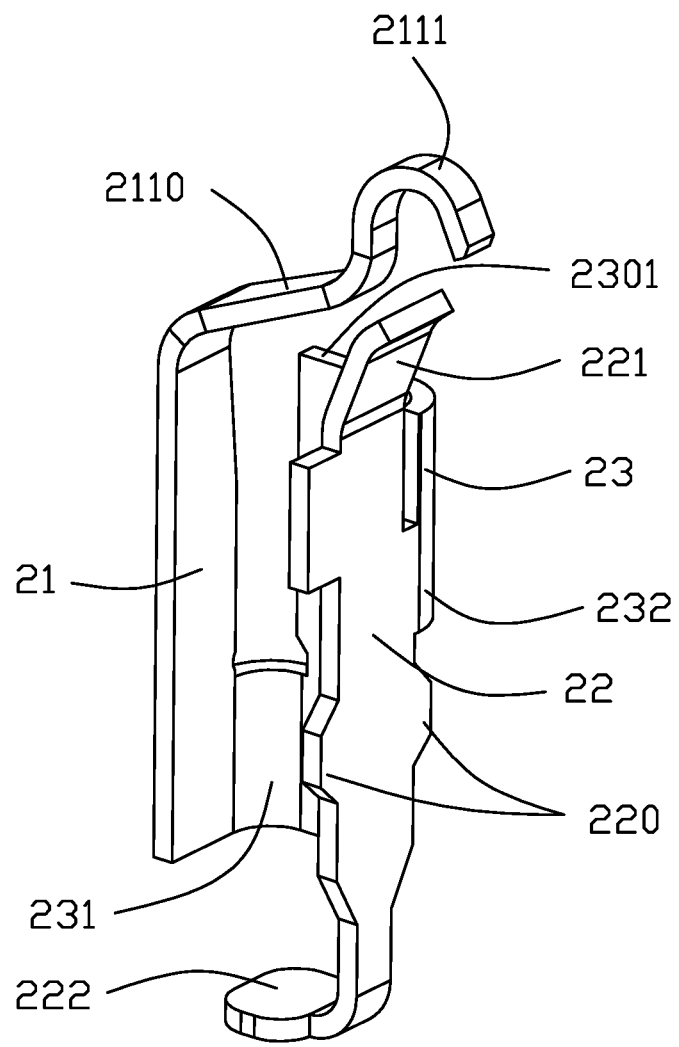
FIG. 13 is a perspective view of the electrical contact of the electrical connector of FIG. 10.
Figure 14:
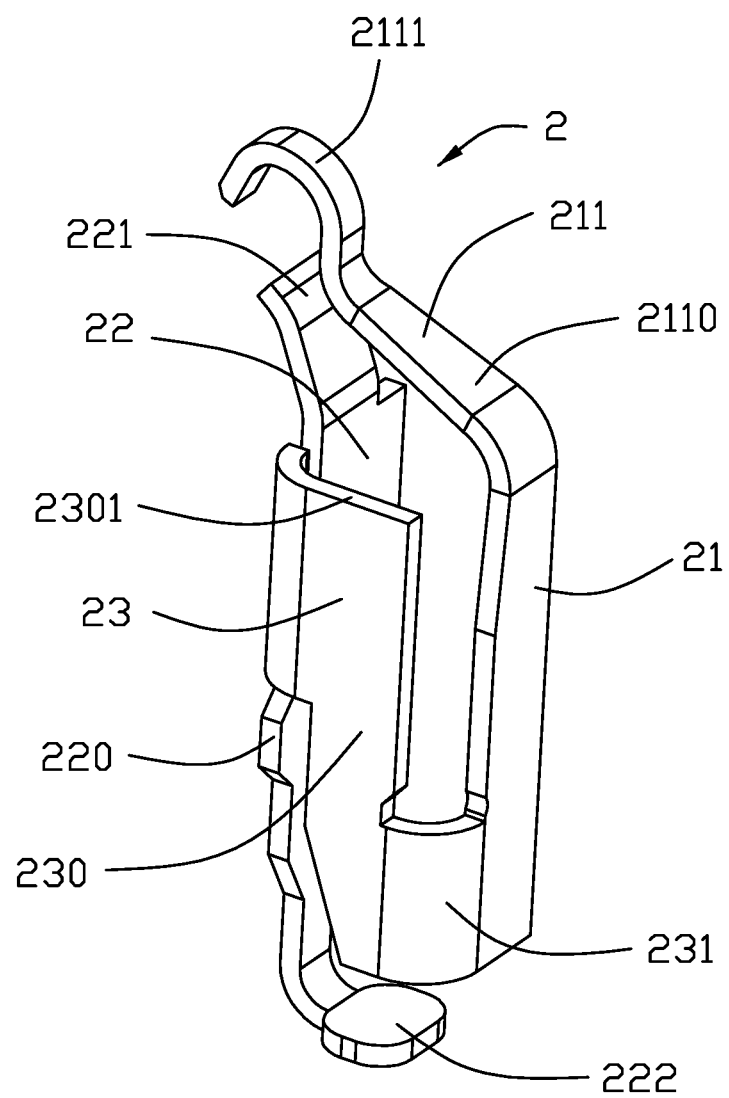
FIG. 14 is another perspective view of the electrical contact of the electrical connector of FIG. 10.
Figure 15:
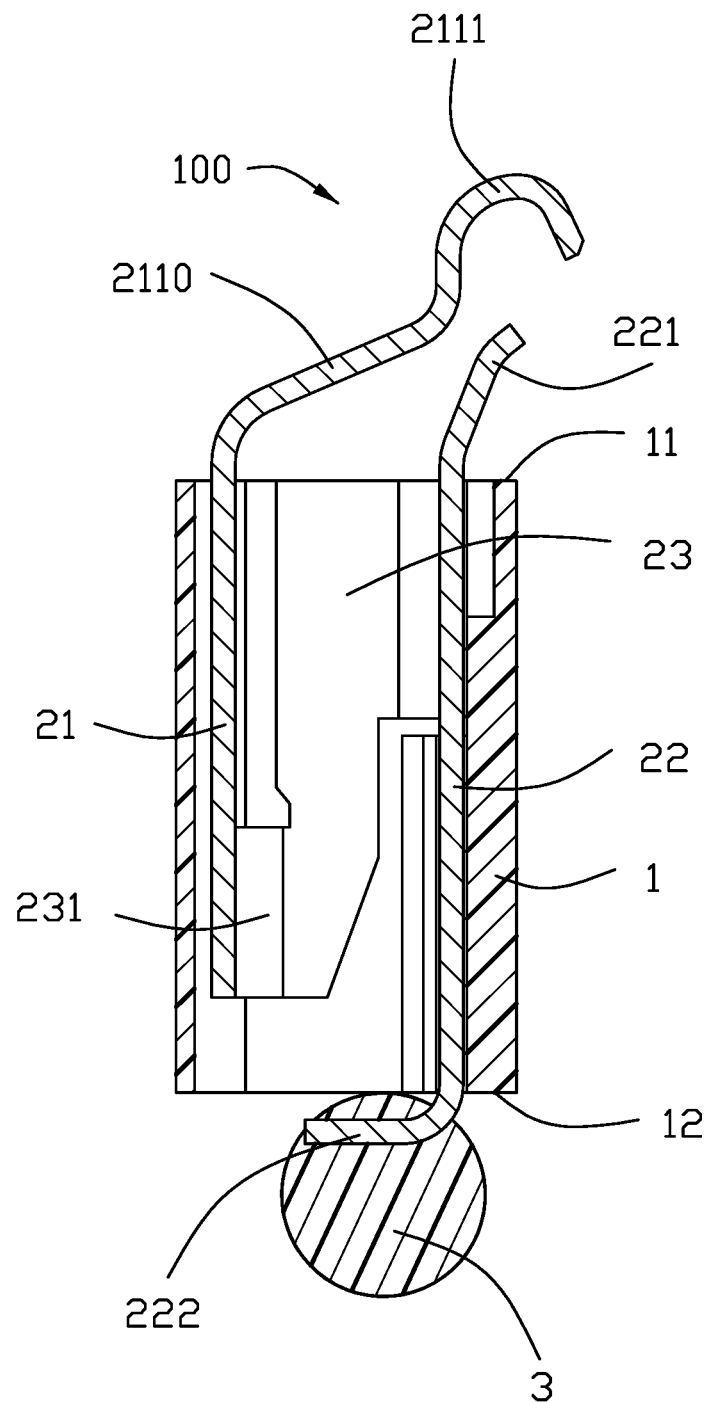
FIG. 15 is a cross-sectional view of the electrical connector of FIG. 10.
Figure 16:
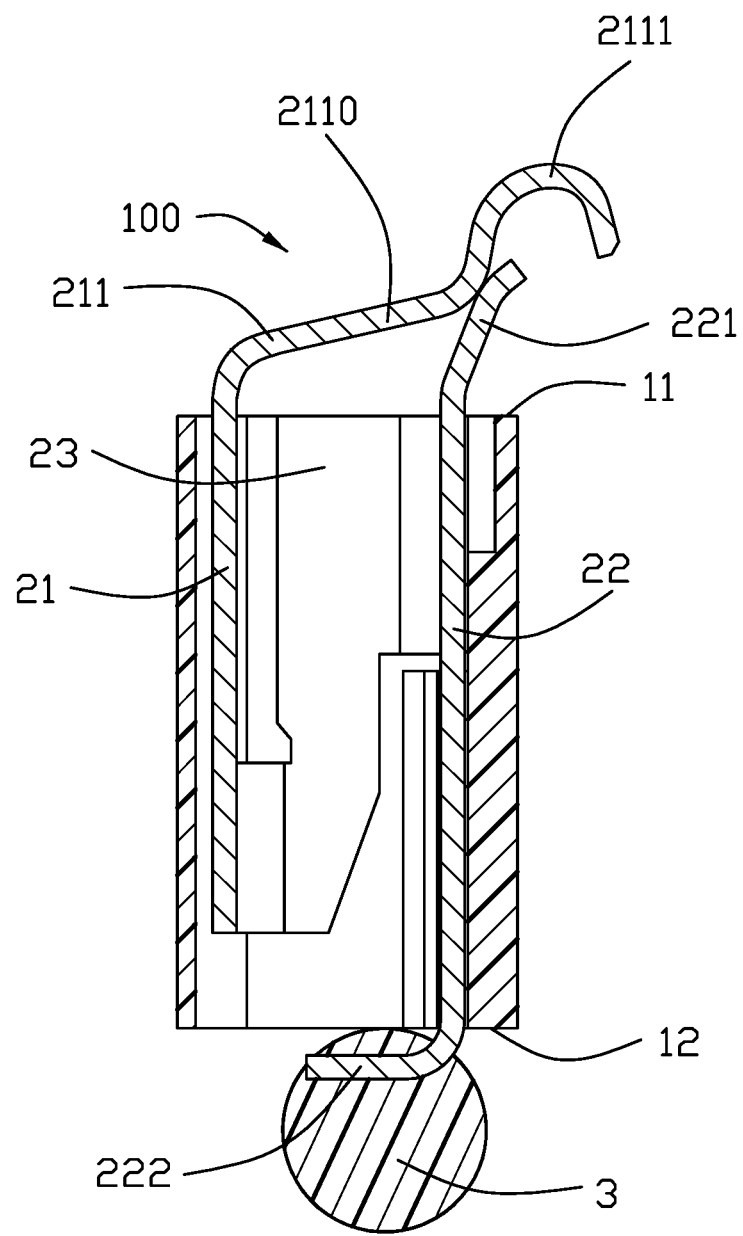
FIG. 16 is a cross-sectional view of the electrical connector of FIG. 10 when the spring arm is downwardly deflected.
Figure 17:
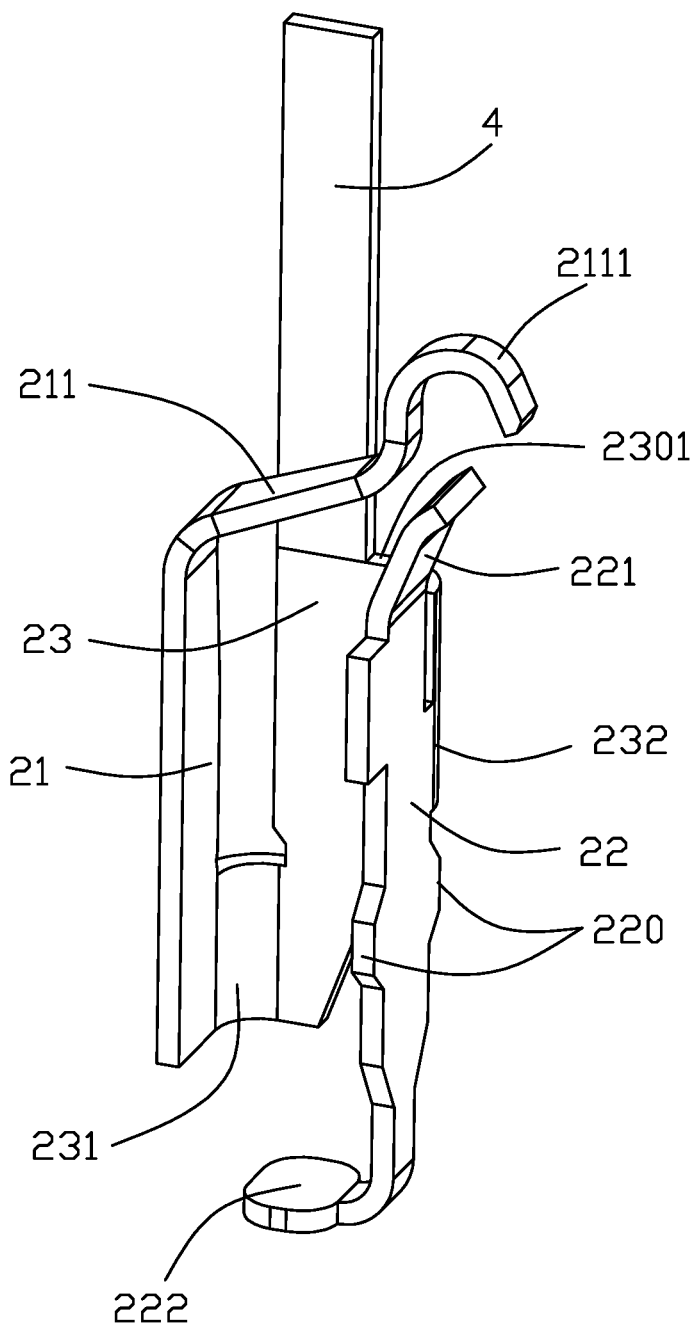
FIG. 17 is a perspective view of the electrical contact of the electrical connector of FIG. 13 linked with a carrier.
Figure 18:
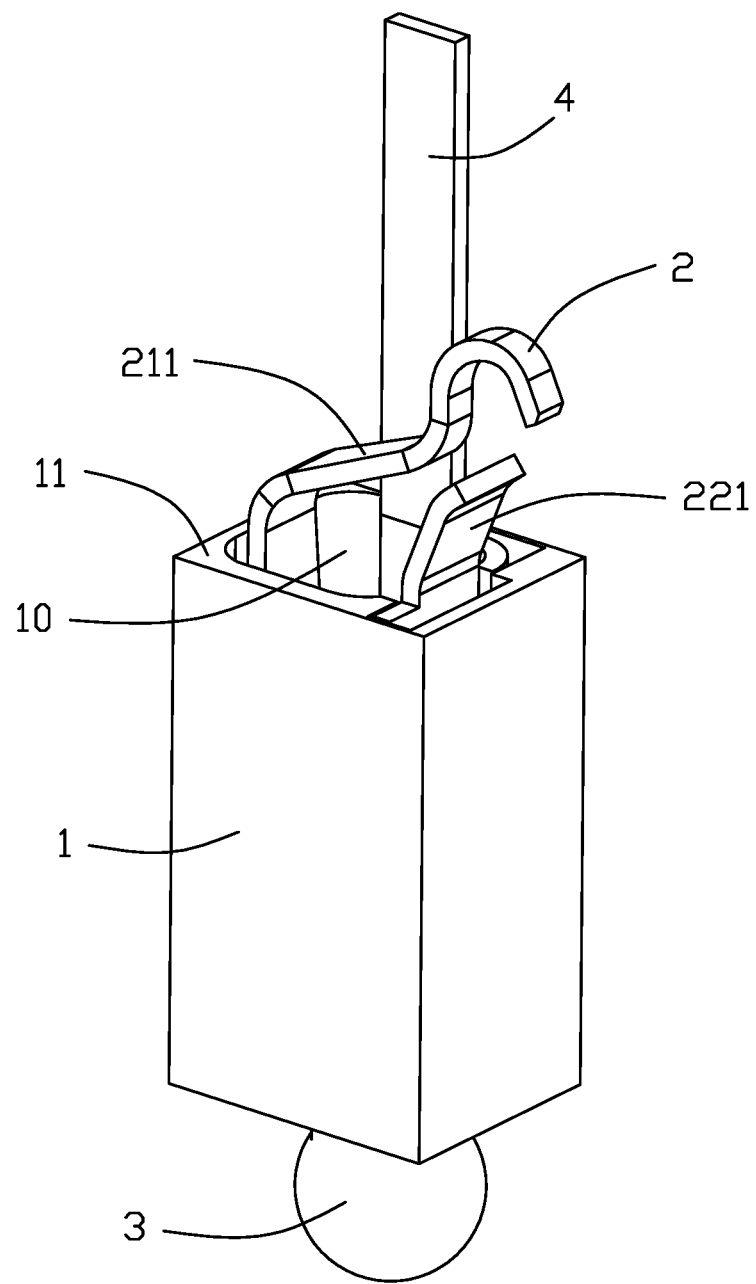
FIG. 18 is a perspective view of the electrical connector of FIG. 10 wherein the contact is linked with the carrier.

FIGS. 10-18 show the second embodiment. The essential difference between the first embodiment and the second embodiment is that in the first embodiment the mating part is isolated from the soldering part with its own barbs for retention in the passageway while in the second embodiment the mating part has no its own barbs for retention but linked to the soldering part via a bridge, thus maybe increasing resiliency thereof. The detailed description is given below.

An electrical connector 100 for connecting a CPU (not shown) to a printed circuit board (not shown), includes an insulative housing 1 with plurality of passageways 10 therein, and a plurality of contacts 2 respectively retained in the corresponding passageways 10. The housing 1 includes opposite top surface 11 and bottom surface 12 in a vertical direction. The passageways 10 extend through both the top surface 11 and the bottom surface 12. The contact 2 includes a mating part (not labeled) having a first body 21 and a soldering part (not labeled) having a second boy 22 opposite to the first body 21 in a sideward direction perpendicular to the vertical direction. Each of the first body 21 and the second body 22 extend in a plane along a transverse direction perpendicular to both the vertical direction and the side direction. A spring arm 211 extends from the first body 21 and beyond the top surface 11. When operation, the spring arm 211 is downwardly pressed by the CPU so as to contact the second body 22. A soldering pad 222 is located at the bottom end of the second body 22, and a curved support arm 221 at the top end of the second body 22. The support arm 221 is located under the spring arm 211 and extends upward away from the first body 21 so as to comply contact the spring arm 221 when the spring arm 211 is downwardly pressed by the CPU. The soldering pad 222 is attached to the printed circuit board (not shown) via the solder ball 3. In this embodiment, the support arm 221 extends above the top surface 11, and the soldering pad 222 is located below the bottom surface 12. A bridge 23 is linked between the first body 21 and the second body 22 so as to have the whole contact 2 have a U-shaped structure thereof.

The spring arm 211 includes a bending section 2110 extending from the first body 21 toward the second body 22, and a contacting section 2111 extending from the oblique section 2112 for contacting the CPU. During operation, the spring arm 211 is downwardly pressed by the CPU to contact the support arm 221 around the junction between the bending section 2110 and the contacting section 2111, thus enhancing the mechanical characteristic. A relatively short electrical path is formed through the spring arm 211 and the support arm 221 toward the soldering pad 222, similar to that in the first embodiment.

The bridge 23 includes a third body 230, a first connecting section 231 extending from one side of the third body 230 toward the first body 21, and a second connecting section 232 extending from the other side of the third body 230 toward the second body 22. In this embodiment, the second body 22 is equipped with the barbs 220 for engagement within the corresponding grooves (not labeled). In this embodiment, the second connecting section 232 is located above the barbs 220 while the first connecting section 231 is located at the same level with the barbs 220. The lower position of the first connecting section 231 may provide more resiliency of the spring arm 211. In an alternate embodiment, the barbs may be formed on the lower portion of the first body and the first connecting section may be located at a higher position while the second body is not equipped with the barbs.

The third body 23 includes an upper edge 2301, around the top surface 11, to which contact carrier is originally connected for assembling the contact 2 into the corresponding passageway 10. Clearly, in this embodiment, the first body 21 where the spring arm 211 is connected, the second body 22 where the barbs 220 are formed, and the third body 23 where the contact carrier is originally linked, are respectively located upon different vertical planes, so it is relative easy for assembling and complying with the pad arrangement of the CPU and that of the printed circuit board.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector for an electronic package, comprising:
   an insulative housing forming a plurality of passageways extending through opposite top and bottom surfaces of the housing in a vertical direction;
   a plurality of contacts disposed in the corresponding passageways, respectively,
   each of said contacts including:

a mating part having a first body and a spring arm extending upwardly from an upper end of the first body and above the top surface; and a soldering part having a second body parallel to the first body, a soldering pad extending downwardly from a lower end of the second body, and a support arm extending upwardly from an upper end of the second body and located under the spring arm in the vertical direction around the top surface; wherein each of said first body and said second body extends in a vertical plane along a transverse direction perpendicular to the vertical direction, and said first body and said second body being spaced from each other in a sideward direction perpendicular to both the vertical direction and the transverse direction; wherein during operation, the spring arm is downwardly pressed by the electronic package and initially performing in a cantilevered manner while successively in a restrained manner after seated upon the support arm;

wherein the support arm extends above the top surface;

wherein the housing includes a plurality of standoffs on the top surface higher than the support arm while lower than the spring arm.

2. The electrical connector as claimed in claim 1, wherein each of said first body and said second body is equipped with barbs on opposite side edges.

3. The electrical connector as claimed in claim 2, wherein no physical connection between the first body and the second body in the sideward direction.

4. The electrical connector as claimed in claim 1, wherein the first body forms a pair of slits beside the spring arm.

5. An electrical connector for an electronic package, comprising:

an insulative housing forming a plurality of passageways extending through opposite top and bottom surfaces of the housing in a vertical direction;

a plurality of contacts disposed in the corresponding passageways, respectively, each of said contacts including:

a mating part having a first body and a spring arm extending upwardly from an upper portion of the first body and above the top surface; and a soldering part having a second body, a soldering pad extending downwardly from a lower portion of the second body, and a support arm extending upwardly from an upper portion of the second body and located under the spring arm in the vertical direction; wherein each of said first body and said second body extends in a vertical plane and said first body and said second body being spaced from each other; wherein during operation, the spring arm is downwardly pressed by the electronic package and initially performing in a cantilevered-beam manner while successively in a restrained-beam manner after seated upon the support arm; wherein the support arm extends above the top surface;

wherein the housing further forms a plurality of standoffs on the top surface beside the corresponding passageways, respectively, and said standoffs are higher than the support arms while lower than the spring arms.

6. The electrical connector as claimed in claim 5, wherein the first body and the second body are connected to each other via a third body in a transverse direction perpendicular to the vertical direction.

7. The electrical connector as claimed in claim 1, wherein a bridge is connected between the first body and the second body, and includes a third body extending in a plane along the sideward direction.

8. The electrical connector as claimed in claim 7, wherein the second body is equipped with barbs two opposite side edges while the first body is not equipped with barbs.

9. The electrical connector as claimed in claim 8, wherein a first connecting section is connected between the first body and the third body, and a second connecting section is connected between the second body and the third body.

10. The electrical connector as claimed in claim 9, wherein the first connecting section is lower than the second connecting section.

11. The electrical connector as claimed in claim 7, wherein an upper end of the third body is located adjacent to the top surface for initially connecting a contact carrier.

12. The electrical connector as claimed in claim 1, wherein the spring arm includes a bending section extending upwardly from the upper end of the first body, and a contacting section extending upwardly from the bending section for contacting the electronic package, and a junction between the bending section and the contacting section abuts against the support arm during operation.

13. The electrical connector as claimed in claim 1, wherein the support arm extends obliquely away from the mating part so as to comply with a configuration of the spring arm.

14. The electrical connector as claimed in claim 5, wherein each of said first body and said second body is equipped with barbs for retention.

15. The electrical connector as claimed in claim 5, wherein the spring arm includes a bending section extending upwardly from the upper portion of the first body, a contacting section extending upwardly from the bending section, and a junction between the contacting section and the bending section is seated upon the support arm during operation.

16. The electrical connector as claimed in claim 5, wherein the first body and the second body are parallel to each other along a transverse direction perpendicular to the vertical direction while opposite to each other in a sideward direction perpendicular to both the vertical direction and the transverse direction.

17. The electrical connector as claimed in claim 6, wherein an upper end of the third body is located adjacent to the top surface to initially connect to a contact carrier for assembling the contact into the corresponding passageway.

* * * * *